(12) United States Patent
Vogt et al.

(10) Patent No.: US 7,538,034 B2
(45) Date of Patent: May 26, 2009

(54) INTEGRATED CIRCUIT HAVING A METAL ELEMENT

(75) Inventors: Mirko Vogt, Dresden (DE);
Yung-Chang Wang, Dresden (DE);
Stephan Hartmann, Dresden (DE)

(73) Assignee: Qimonda AG, Munich (DE)

( * ) Notice: Subject to any disclaimer, the term of this patent is extended or adjusted under 35 U.S.C. 154(b) by 249 days.

(21) Appl. No.: 11/644,285

(22) Filed: Dec. 22, 2006

(65) Prior Publication Data
US 2008/0150136 A1    Jun. 26, 2008

(51) Int. Cl.
*H01L 21/44* (2006.01)
(52) U.S. Cl. ...................... 438/671; 438/737
(58) Field of Classification Search ................ 438/243, 438/585, 631, 737, 750, 671; 257/E23.141, 257/E21.476
See application file for complete search history.

(56) References Cited

U.S. PATENT DOCUMENTS

| | | | | |
|---|---|---|---|---|
| 4,960,489 A * | 10/1990 | Roeska et al. | ............... | 438/627 |
| 5,439,847 A * | 8/1995 | Chittipeddi et al. | ......... | 438/656 |
| 6,130,155 A * | 10/2000 | Chen et al. | ................... | 438/635 |
| 6,268,287 B1 * | 7/2001 | Young et al. | ................ | 438/671 |
| 6,511,911 B1 * | 1/2003 | Besser et al. | ................ | 438/656 |
| 7,259,063 B2 * | 8/2007 | Lee | ............................ | 438/257 |
| 2005/0009350 A1 | 1/2005 | Vogt | | |
| 2005/0112506 A1 | 5/2005 | Czech et al. | | |
| 2005/0181604 A1 | 8/2005 | Sperlich et al. | | |

* cited by examiner

*Primary Examiner*—Lisa M Caputo
*Assistant Examiner*—Stacy P Barbadillo
(74) *Attorney, Agent, or Firm*—Dicke, Billig, Czaja, PLLC

(57) ABSTRACT

An integrated circuit is disclosed. The integrated circuit includes a substrate, a metal element, the metal element being arranged on the substrate and including a metal material. A composite element is located over to the metal element, the composite element including the metal material and an additive material.

19 Claims, 5 Drawing Sheets

INTEGRATED CIRCUIT HAVING A METAL ELEMENT

BACKGROUND

The present invention relates to a method of fabricating a metal element in an integrated circuit. The present invention further relates to an integrated circuit.

SUMMARY

Demands imposed on large scale integrated circuits, such as electronic memory devices, microprocessors, signal processors, and integrated logic devices, are constantly increasing. In the case of the electronic memory devices, said demands mainly translate into increasing access speed and enlarge storage capacity. As far as modern memory devices are concerned, the computer industry has established, amongst others, the so-called DRAM (Dynamic Random Access Memory) as economic means for high speed and high capacity data storage.

Although a DRAM requires continuous refreshing of the stored information, speed and information density, combined with a relatively low cost, have put the DRAM to a pivotal position in the field of information technology. Almost every type of computer system, ranging, for example, from PDAs over notebook computers and personal computers to high-end servers, takes advantage of this economic and fast data storage technology. Besides the DRAM, the computer industry develops alternatives, such as phase change RAM (PCRAM), conductive bridging RAM (CBRAM), and magneto-resistive RAM (MRAM). Other concepts include the so-called flash-RAM or static RAM (SRAM).

While the storage capacity of a memory device is increased, the minimum feature size of such an integrated circuit becomes smaller and smaller. Reducing this minimum feature size imposes high demands, amongst other issues, on the quality and size of metal elements. Such metal elements may be found in an integrated circuit (IC), for example, as metal circuit paths. Such circuit paths may serve for the interconnection of various electronic entities, such as storage capacitors, selection transistors, driver circuits, and other electronic devices and entities as being common in semiconductor technology.

Conventional methods of structuring a metal layer in order to produce metal elements include a formation of a mask on top of a metal layer; structuring the mask layer; and eventually transferring the structured features of the mask layer into the metal layer. The transfer of the mask layout into the metal layer may be effected by etching processes. During structuring, it may be required that the mask adheres sufficiently well to the metal layer in order to guarantee a reliable structuring and avoid other process problems, such as impurity problems and layout defects.

Conventional methods therefore include a provision of an interstitial layer between the metal layer and the mask layer to provide a reliable adhesion of the mask to the metal during structuring. However, upon further reducing the structure size, an interstitial layer may not be able to provide a sufficient adhesion, and structuring becomes prone to failures, which may disadvantageously affect device functionality and process yield.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Various embodiments of the present invention may provide particular advantages for an improved method of fabricating an integrated circuit having a metal element, an improved integrated circuit, and an improved memory device.

In one embodiment, a method of fabricating a metal element in an integrated circuit is provided. The method includes: providing a substrate; providing a metal layer on the substrate, the metal layer including a metal material. A first composite layer is provided on the metal layer, the first composite layer being arranged adjacent to the metal layer. The first composite layer includes the metal material and an additive material. A second composite layer is provided on the first composite layer, the second composite layer being arranged adjacent to the first composite layer, the second composite layer includes the additive material and a mask material. A mask layer is provided on the second composite layer; and structuring the series of layers such to form the metal element.

In one embodiment, an integrated circuit is provided, the integrated circuit having: a substrate; a metal element being arranged on the substrate, the metal element including a metal material; and a composite element adjacent to the metal element, the composite element including the metal material and an additive material.

In one embodiment, a memory device is provided. The memory device includes a substrate; a conductive element being arranged on the substrate, the conductive element including a metal material; and a composite element adjacent to the conductive element, the composite element including the metal material and an additive material.

Figure 1A:
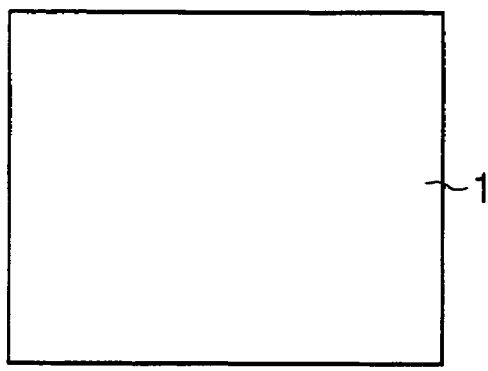
FIG. 1A through 1I illustrate schematic views of fabricating a metal element in an integrated device, according to a first embodiment of the present invention.

FIG. 1A to 1I illustrate the fabrication of a metal element in an integrated circuit in various stages during fabrication, according to a first embodiment of the present invention. The integrated circuit includes a substrate 1, which is provided during an initial stage as illustrated in FIG. 1A. The substrate 1 may already include electronic entities, such as transistors, capacitors, resistors, and contacts. Those entities may have been realized by an etching process, lithographic patterning, deposition, and/or doping techniques. Those techniques may be part of a CMOS process.

A base material for the substrate 1 may be silicon, gallium arsenide, or other semiconductor materials as they are known from the technology for the manufacturing of integrated circuits. The substrate 1 may further includes n- or p-doped wells for forming conductors or isolating regions within the substrate 1.

Figure 1B:
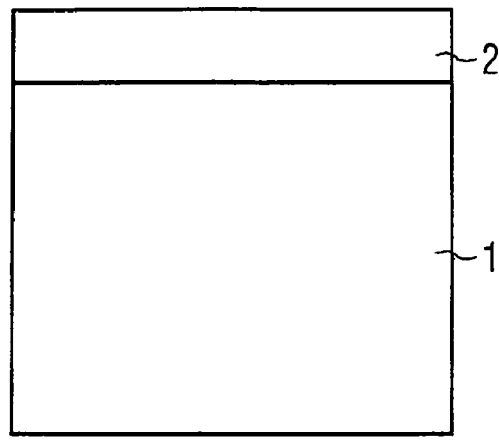

In a subsequent process, a metal layer 2 is provided, as illustrated in FIG. 1B. The metal layer 2 may include a metal material, such as aluminum, gold, copper, titanium, tungsten, silver, platinum, and/or another suitable conductor material. In the latter general case of other suitable conductor materials, a suitable semiconductor material may also provide a conductivity similar to a metal, apart from conventional metals. Examples of such materials include polycrystalline silicon or highly-doped silicon. A metal layer 2 may be provided such to form a contact to electronic entities which may be arranged in or on the substrate 1.

The metal layer 2 may be provided by a physical vapor deposition (PVD) technique, sputtering, thermal deposition, or a plasma enhanced chemical vapor deposition technique (PECVD). During a PVD a process pressure may be below 1 torr, in one embodiment in the range of milli-torrs, and a flow of a gaseous material may be below 100 standard cubic centimeters per minute (sccm), in one embodiment in the range of a few tens of sccm. The above-mentioned unit sccm refers to the flow of an amount of a gaseous substance at standard pressure and standard temperature conditions per minute. Furthermore, using, for example, PECVD, may allow for an in-situ provision of more than one layer.

Figure 1C:
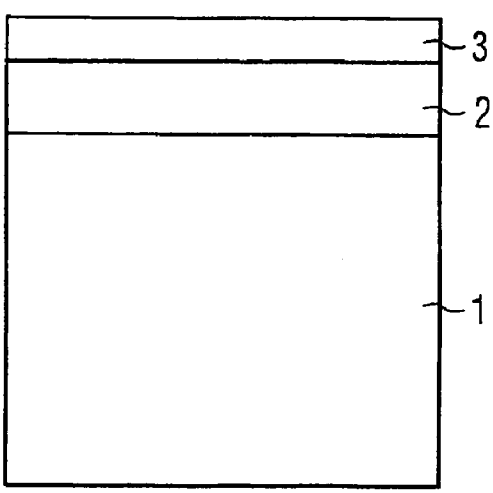

In a subsequent process, a first composite layer 3 is provided on the metal layer 2, as illustrated in FIG. 1C. The first composite layer 3 may include the metal material of the metal layer 2 and an additive material. The additive material may include nitrogen, nitrogen-compounds, phosphorus, arsenic, antimony, bismuth, and/or other suitable additive materials.

As a result, the first composite layer 3 may include a composite material being composed, for example, from aluminum and nitrogen or aluminum-nitride. The first composite layer may be provided by driving the additive material into parts of the metal layer 2, for example, into an upper section of the metal layer 2. The driving of the additive material may be effected by means of an exposure of the metal layer 2 to the additive material. The additive material may be provided in a plasma in the vicinity of the metal layer 2, driving the additive material into the metal layer 2. Also, purging a surrounding of the metal layer 2 with the additive material may suffice for driving the additive material into the metal layer 2. During exposure or purging, the metal layer 2 may further be at an elevated temperature, such as a temperature at and above 350° C. Driving the additive material into the metal layer 2 may be effected in-situ, together with the provision of the metal layer 2, for example in a PVD process chamber, or ex-situ in another process chamber after provision of the metal layer 2.

Alternatively, the first composite layer 3 may be provided by reactive sputtering during a PVD process. This may be effected in-situ, together with the metal layer 2. Firstly, the metal layer 2 is provided on the substrate, and, secondly, the additive material or a precursor of the additive material is added to the process atmosphere, leading to reactive sputtering of the first composite layer 3. During such a PVD, a process pressure may be below 1 torr, preferably in the range of milli-torrs, and a flow of a gaseous material, comprising the additive material, may be below 100 standard cubic centimeters per minute (sccm), preferably in the range of a few tens of sccm. Subsequent layers, such as a second composite layer and/or a mask layer, may now follow being provided together in-situ in a another process chamber, such as a PECVD process chamber. Examples for a second composite layer and a mask layer are the layers 4, 5, which will be described in greater detail in conjunction with FIG. 1D and FIG. 1F, respectively.

The metal layer 2 and the first composite layer 3 may further be fabricated in a single process stage, for example, in a single process chamber in situ by a plasma enhanced chemical vapor deposition (PECVD). During such a deposition, the metal layer 2 and the first composite layer 3 may be formed by changing the composition of the process atmosphere in time. During such a PECVD, for example, firstly only the precursors or material for forming the metal layer 2 are present in the process chamber, whereas, secondly, a precursor of the additive material or the additive material itself is added to the process atmosphere, such to form the composite layer 3.

A process pressure in the process chamber may be in the range of 1 to 10 torrs, in one embodiment in the range of 5 to 7 torrs, the incident power for generating a plasma may be in the range of 300 to 2000 watts, in one embodiment in the range of 1000 to 2000 watts. The process atmosphere during the deposition of the first composite layer 3 may include a nitrogen plasma with an inflow of gaseous nitrogen and/or ammonia in the range of 500 to 20000 standard cubic centimeters per minute (sccm), in one embodiment in the range of 5000 to 10000 sccm. The plasma may be generated for a duration in the range of 3 to 120 seconds, in one embodiment in the range of 20 to 40 seconds.

Figure 1D:
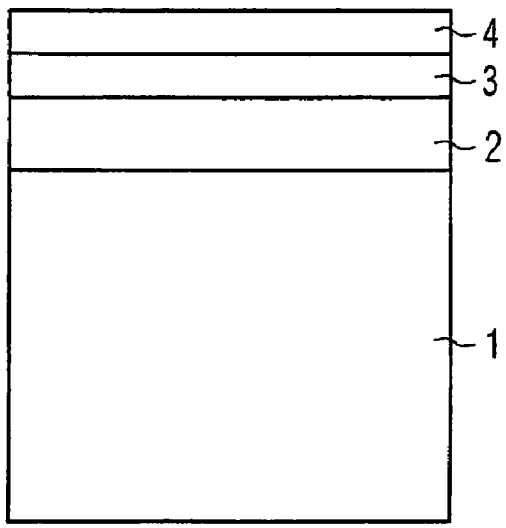

In a subsequent process, a second composite layer 4 is provided on the first composite layer 3, as illustrated in FIG. 1D. The second composite layer may have a layer thickness in the range of 2 to 100 nm, in one embodiment in the range of 5 to 50 nm or in one embodiment in the range of 10 to 30 nm. The second composite layer 4 may include the additive material of the first composite layer 3 and a mask material. The additive material may be the same additive material as that of the first composite layer 3. The mask material may include carbon, silica, or silicon-nitride. Carbon may be provided in an amorphous state or crystalline, such as poly-crystalline diamond. The second composite layer 4 may incldue Nitrogen-doped carbon, with a nitrogen concentration in the range of 2 to 15%.

The second composite layer 4 may be provided during one stage in conjunction with the metal layer 2 and the first composite layer 3. Said layers may be fabricated in a single process stage, for example, in a single process chamber in situ by means of a plasma enhanced chemical vapor deposition (PECVD). During such a deposition, the metal layer 2, the first composite layer 3, and the second composite layer 4 may be formed by changing the composition of the process atmosphere in time.

During such a PECVD, for example, only the precursors or material for forming the metal layer 2 are present in the process chamber and a precursor of the additive material or the additive material itself is added, and, eventually, the precursors for forming the metal layer 2 are replaced by the precursors or materials for forming the second composite layer 4. The precursors or materials for forming the second composite layer 4 may include the mask material. A process pressure in the process chamber may be in the range of 1 to 10 torrs, in one embodiment in the range of 5 to 7 torrs, the incident power for generating a plasma may be in the range of 300 to 2000 watts, in one embodiment in the range of 1000 to 2000 watts. The process atmosphere during the deposition of the first composite layer 3 may include a nitrogen plasma with an inflow of gaseous nitrogen and/or ammonia in the range of 500 to 20000 standard cubic centimeters per minute (sccm), in one embodiment in the range of 5000 to 10000 sccm. The plasma may be generated for a duration in the range of 3 to 120 seconds, in one embodiment in the range of 20 to 40 seconds.

Figure 1E:
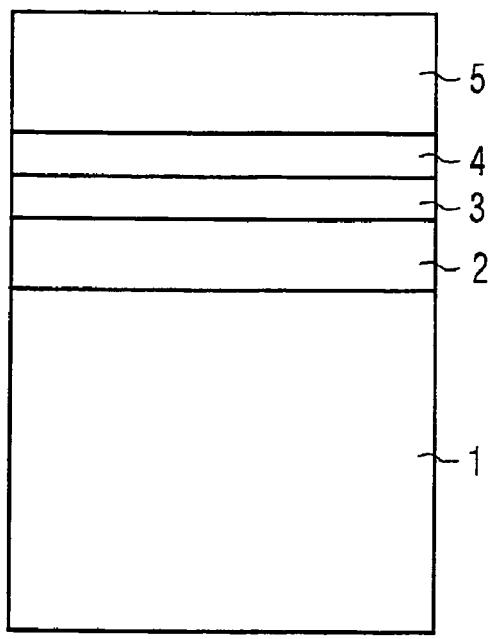

In a next stage, a mask layer 5 is provided on the second composite layer 4, as illustrated in FIG. 1E. The mask layer 5 may have a layer thickness in the range of 100 to 600 nm, in one embodiment in the range of 300 to 500 nm. The mask layer 5 may include the mask material of the second composite layer 4 and may include carbon, silica, or silicon-nitride. Carbon may be provided in an amorphous state or crystalline, such as poly-crystalline diamond. The mask layer 5 may include a so-called hard mask.

The mask layer 5 may be provided during one stage in conjunction with the metal layer 2, the first composite layer 3, and the second composite layer 4. The layers may be fabricated in a single process stage, for example, in a single process chamber in situ by a plasma enhanced chemical vapor deposition (PECVD). During such a deposition, the metal layer 2, the first composite layer 3, the second composite layer 4, and the mask layer 5 may be formed by changing the composition of the process atmosphere in time.

During such a PECVD, for example, only the precursors or material for forming the metal layer 2 are present in the process chamber, secondly, a precursor of the additive material or the additive material itself is added, then the precursors for forming the metal layer 2 are replaced by the precursors or materials for forming the second composite layer 4, and, eventually, the precursor of the additive material or the additive material itself is removed from the process chamber. A process pressure in the process chamber may be in the range of 1 to 10 torrs, preferably in the range of 5 to 7 torrs, the incident power for generating a plasma may be in the range of 300 to 2000 watts, preferably in the range of 1000 to 2000 watts. The process atmosphere during the deposition of the first composite layer 3 may include a nitrogen plasma with an inflow of gaseous nitrogen and/or ammonia in the range of 500 to 20000 standard cubic centimeters per minute (sccm), in one embodiment in the range of 5000 to 10000 sccm. The plasma may be generated for a duration in the range of 3 to 120 seconds, in one embodiment in the range of 20 to 40 seconds.

Alternatively, the metal layer 2 and the first composite layer 3 may be provided in-situ in one process chamber, such as a PVD process chamber. Subsequently, the second composite layer 4 and the mask layer 5 may be formed in-situ in another process chamber, such as PECVD process chamber, by changing the composition of the process atmosphere in time. Exemplary process parameters are given in the preceding description.

An example for a layer stack may thus be a metal layer 2 including aluminum, a first composite layer 3 including aluminum and nitrogen, a second composite layer 4 comprising carbon and nitrogen, and a mask layer 5 including carbon.

Figure 1F:
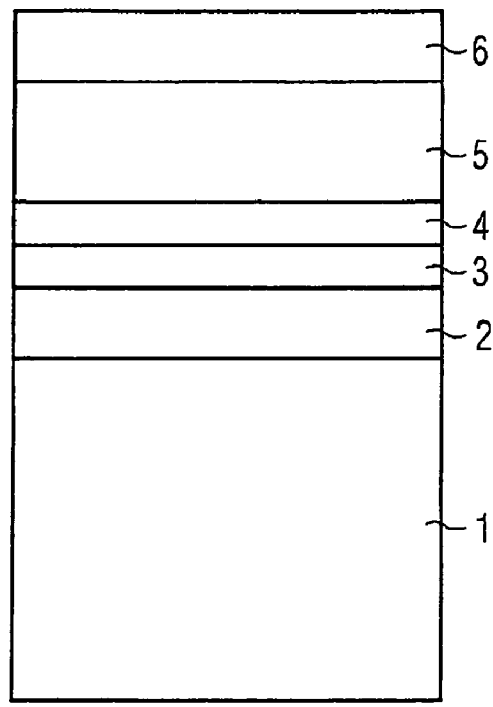

Next, a further mask layer 6 is provided on the mask layer 5, as illustrated in FIG. 1F. The further mask layer 6 may include a resist which may be patterned lithographically by means of a selective exposure of the further mask layer 6 to radiation. The radiation may be ultraviolet radiation, x-ray radiation, or electron-beam radiation. The further mask layer 6 may change its properties upon exposure to the radiation such that it becomes soluble in a developing solution. The further mask layer 6 may further change its properties upon exposure to the radiation such that it becomes insoluble in developing solution, whereas the unexposed regions of the further mask layer 6 remain soluble in the developing solution. A positive resist is a type of resist in which the portion of the resist that is exposed to light or radiation becomes soluble to a developer and the portion of the resist that is unexposed remains insoluble to the developer. A negative resist is a type of resist in which the portion of the resist that is exposed to light or radiation becomes relatively insoluble to the developer. The unexposed portion of the resist is dissolved by the developer.

Figure 1G:
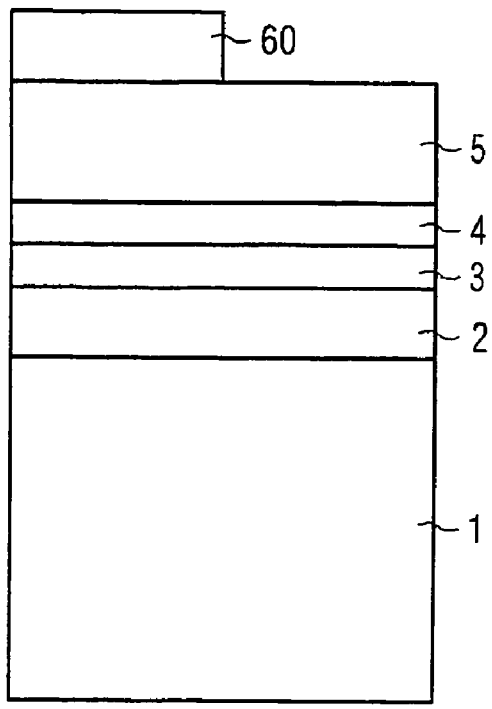

An example for a positive resist may be the common resist used for photolithographic processes, whereas an example for a negative resist, especially for the case of patterning the further mask layer 6 by means of an electron beam, may include polymethylmethaacrylate (PMMA). After appropriate exposure and developing, the further mask layer 6 is transferred to a patterned further mask layer 60 which includes the desired layout, as illustrated in FIG. 1G. The patterned further mask layer 60 in part still covers the mask layer 5, whereas other parts of the mask layer 5 are now exposed.

The further mask layer 6, 60 may include silica, silicon-nitride, or silicon-oxy-nitride. Furthermore, the further mask layer 6, 60 may include additional layers, such as an anti-reflection coating (ARC).

Figure 1H:
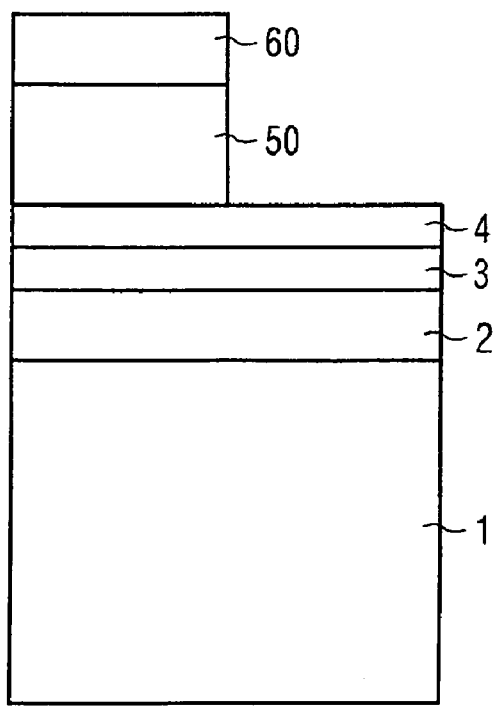

During a next stage, the mask layer 5 is pattern by the further mask layer 60, as illustrated in FIG. 1H. The mask layer 5 is transferred into a patterned mask layer 50, which in part still covers the second composite layer 4, whereas it exposes other parts of the second composite layer 4. The patterning of the mask layer 5 may be effected by an etching process, including isotropic, anisotropic, selective, wet, and/or dry etching techniques. An example for a structuring technique for etching the mask layer 5 may include an anisotropic dry etching process, such as reactive ion etching (RIE). During such an RIE-etching step a process atmosphere may include chlorine, fluorine, bromine, hydrogen, hydrogen-bromide, oxygen, haloalkanes, chlorofluorocarbons, or hydrochlorofluorocarbons.

Figure 1I:
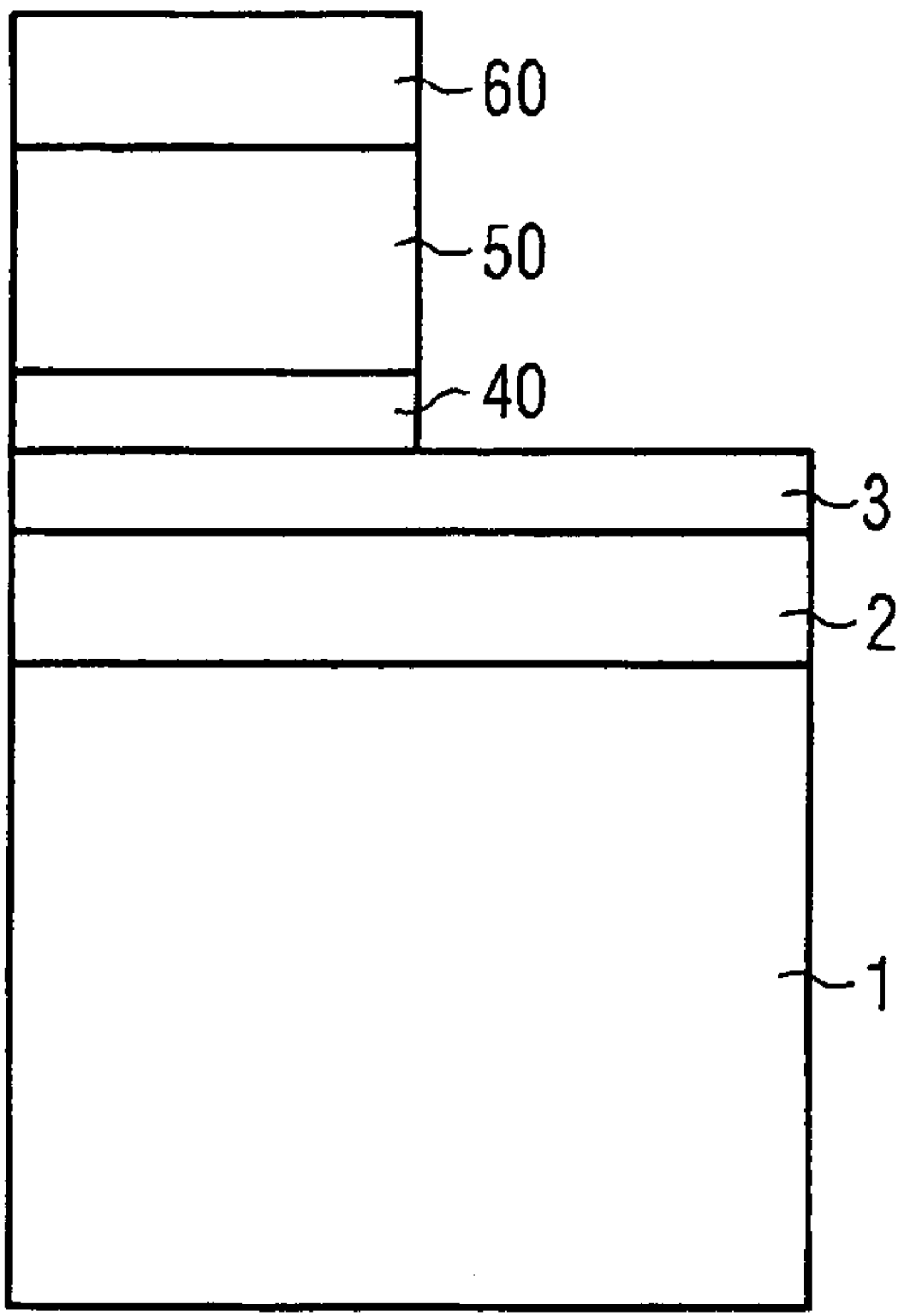

During a next stage, the second composite layer 4 is patterned, as illustrated in FIG. 1I. The second composite layer 4 is patterned such to be transferred into a patterned second composite layer 40. The same etching technique as used for structuring the mask layer 5 may be employed for patterning the second composite layer 4. Also, both layers, the mask layer 5 and the second composite layer 4, may be etched in a single process.

Figure 2A:
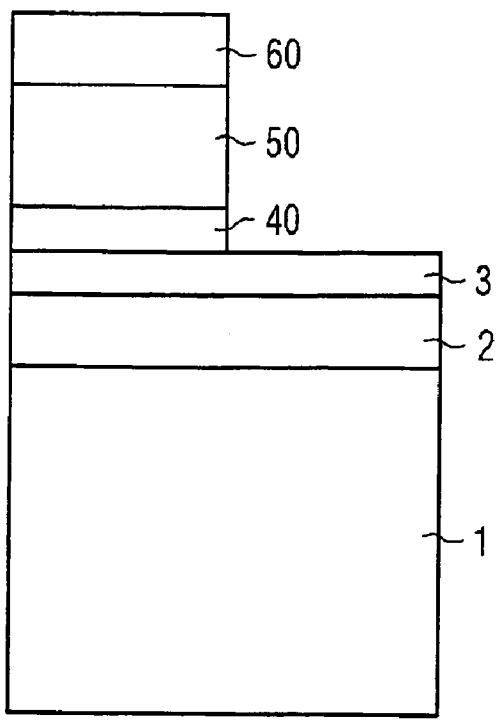
FIG. 2A through 2D illustrate schematic views of fabricating a metal element in an integrated device, according to a second embodiment of the present invention.
Figure 2B:
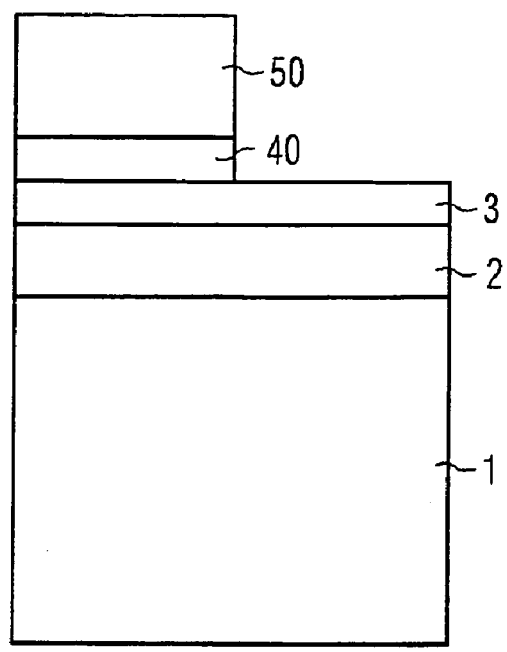

FIGS. 2A to 2D illustrates a further processing such to fabricate a metal element in an integrated circuit, according to a second embodiment. FIG. 2A illustrates the integrated circuit in the state as illustrated and described in conjunction with FIG. 1I. According to this embodiment, the patterned further mask layer 60 may be removed during a next stage, as illustrated in FIG. 2B. The removal of the patterned further mask layer 60 may be effected by means of organic solvents, such as acetone.

Figure 2C:
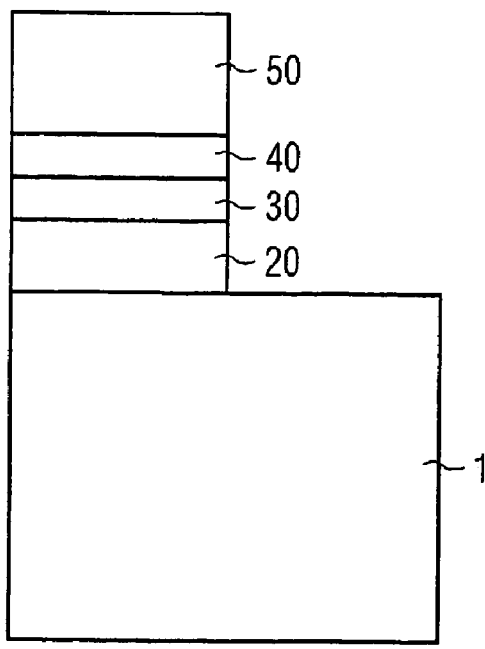

In a next stage as illustrated in FIG. 2C, the first composite layer 3 and the metal layer 2 are patterned such to form the patterned first composite layer 30 and the patterned metal layer 20. Parts of the substrate 1 may be exposed and may also be removed. The patterning of the first composite layer 3 and the metal layer 2 may be effected by an etching process, including isotropic, anisotropic, selective, wet, and/or dry etching techniques. An example for a structuring technique for etching the first composite layer 3 and the metal layer 2 may include an anisotropic dry etching process, such as reactive ion etching (RIE). During such an RIE-etching process, a process atmosphere may include the components as already described in conjunction with FIG. 1H. However, the contents of halogens, such as chlorine and fluorine, may be increased compared to preceding etching stages. Also, the mask layer 5, the second composite layer 4, the first composite layer 3, and the metal layer 2 may be etched in a single process.

Figure 2D:
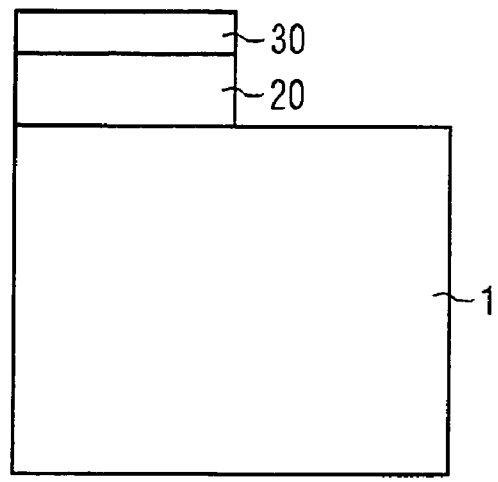

In a next process, the patterned mask layer 50 and the patterned second composite layer 40 may be removed such to leave the patterned metal layer 20 and the patterned first composite layer 30 on the substrate 1, as illustrated in FIG. 2D. The patterned metal layer 20 and the patterned composite layer 30 may form the metal element in an integrated circuit according to the present invention. The removal of the patterned mask layer 50 and the patterned second composite layer 40 may be effected by wet or dry etching techniques. Wet etching may include etching with a so-called piranha solution, wherein the piranha solution may include sulphuric acid, hydrogen peroxide, and/or ammonium hydroxide. Dry etching techniques may include ashing techniques in an oxygen and/or ozone atmosphere and may be supported by a plasma.

Figure 3A:
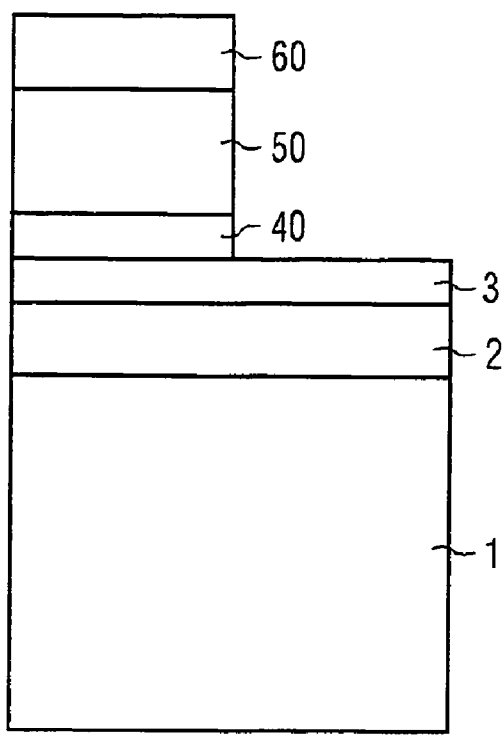
FIG. 3A through 3C illustrate schematic views of fabricating a metal element in an integrated device, according to a third embodiment of the present invention.
Figure 3B:
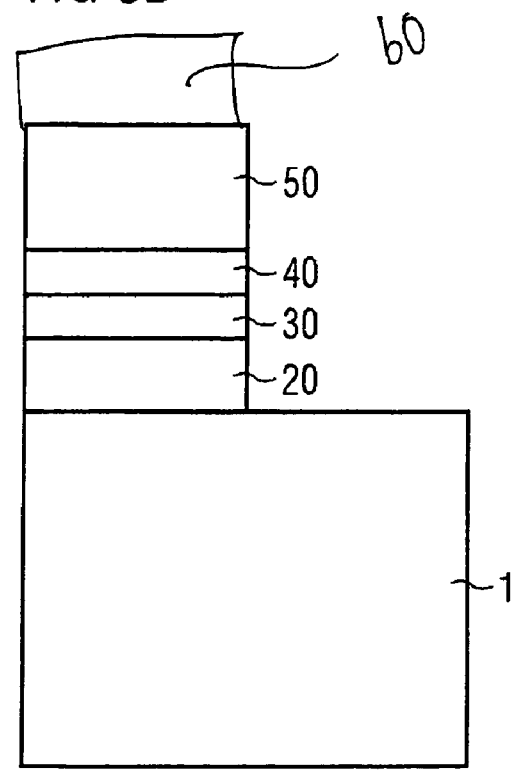
Figure 3C:
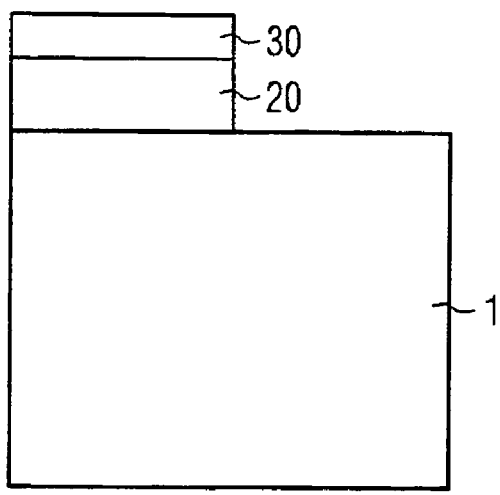

FIG. 3A through 3C illustrate a further processing such to fabricate a metal element in an integrated circuit, according to a third embodiment. FIG. 3A illustrates the integrated circuit in the state as illustrated and described in conjunction with FIG. 1I. According to this embodiment, the first composite layer 3 and the metal layer 2 are patterned such to form a patterned first composite layer 30 and a patterned metal layer 20, as illustrated in FIG. 3B. Parts of the substrate 1 may be exposed and may also be removed.

The patterning of the first composite layer 3 and the metal layer 2 may be effected in one process in situ in conjunction with the patterning of the mask layer 5 and the second composite layer 4, for example, by reactive ion etching (RIE). During such an RIE-etching process, a process atmosphere may include the components as already described in conjunction with FIG. 1H. However, the contents of halogens, such as chlorine and fluorine, may be increased compared to preceding etching stages.

In the next stage, as illustrated in FIG. 3C, the patterned further mask layer 60, the patterned mask layer 50 and the patterned second composite layer 40 are removed. The patterned metal layer 20 and the patterned first composite layer 30 remain on the substrate 1 and may form the metal element according to one embodiment of the invention. The removal of the patterned further mask layer 60 may be effected by organic solvents, such as acetone. The removal of the patterned mask layer 50 and the patterned second composite layer 40 may be effected by wet or dry etching techniques, as already described in conjunction with FIG. 2D.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making an integrated circuit having a metal element comprising:
    forming a series of layers comprising:
        providing a metal layer comprising a metal material, on a substrate;
        forming a first composite layer over the metal layer, the first composite layer comprising the metal material and an additive material;
        forming a second composite layer over the first composite layer, the second composite layer being arranged adjacent to the first composite layer, the second composite layer comprising the additive material and a mask material;
        forming a mask layer over the second composite layer; and
    structuring the series of layers such to form the metal element.

2. The method of claim 1, the structuring of the series of layers comprising:
    providing an opening in the mask layer and in the second composite layer; and
    removing the first composite layer and the metal layer in an area of the opening of the second composite layer.

3. The method of claim 1, the structuring of the series of layers comprising:
    providing an opening in the mask layer;
    removing the second composite layer, the first composite layer, and the metal layer in an area of the opening of the mask layer.

4. The method of claim 1, the structuring of the series of layers comprising:
    providing a further mask layer on the mask layer; and
    providing an opening in the further mask layer for structuring the mask layer.

5. The method of claim 1, comprising providing the metal layer via a physical vapor deposition process.

6. The method of claim 1, comprising forming the first composite layer via driving the additive material into the metal layer.

7. The method of claim 6, the additive material being driven into the metal layer by exposing the metal layer to a plasma comprising the additive material.

8. The method of claim 1, the first composite layer being provided by reactive sputtering.

9. The method of claim 1, the metal layer being provided by a plasma enhanced chemical vapor deposition process.

10. The method of claim 1, the first composite layer being provided by a plasma enhanced chemical vapor deposition process.

11. The method of claim 10, the deposition process being carried out in a plasma at a process pressure in the range of 1 to 10 torr, with an incident power in the range of 300 to 2000 watts for a duration in the range of 3 to 120 seconds.

12. The method of claim 10, the plasma comprising a nitrogen plasma with a flow of gaseous nitrogen in the range of 500 to 20'000 standard cubic centimeters per minute (sccm).

13. The method of claim 1, the second composite layer being provided by a plasma enhanced chemical vapor deposition process.

14. The method of claim 13, the deposition process being carried out in a plasma at a process pressure in the range of 1 to 10 torr, with an incident power in the range of 300 to 2000 watts for a duration in the range of 3 to 120 seconds.

15. The method of claim 13, the plasma comprising a nitrogen plasma with a flow of gaseous nitrogen in the range of 500 to 20'000 standard cubic centimeters per minute (sccm).

16. The method of claim 1, the metal layer and the first composite layer comprising at least one of the following materials: aluminum, gold, copper, titanium, tungsten, silver, platinum, polycrystalline silicon, highly-doped silicon.

17. The method of claim 1, the first composite layer comprising nitrogen.

18. The method as claimed in claim 1, the second composite layer and the mask layer comprising carbon.

19. The method of claim 1, the metal layer and the first composite layer being provided in a first process chamber and the second composite layer and the mask layer being provided in a second process chamber.

\* \* \* \* \*

UNITED STATES PATENT AND TRADEMARK OFFICE
CERTIFICATE OF CORRECTION

PATENT NO. : 7,538,034 B2
APPLICATION NO. : 11/644285
DATED : May 26, 2009
INVENTOR(S) : Mirko Vogt et al.

It is certified that error appears in the above-identified patent and that said Letters Patent is hereby corrected as shown below:

On the Title Page Item (73) should read

Assignee:

Qimonda AG, Munich, Germany

Nanya Technology Corporation, Taoyuan, Taiwan

Signed and Sealed this

First Day of June, 2010

David J. Kappos
*Director of the United States Patent and Trademark Office*